(12) United States Patent
Ham

(10) Patent No.: US 11,150,301 B2
(45) Date of Patent: Oct. 19, 2021

(54) BATTERY PACK

(71) Applicant: LG Chem, Ltd., Seoul (KR)

(72) Inventor: Sang-Hyeok Ham, Daejeon (KR)

(73) Assignee: LG Chem, Ltd.

( * ) Notice: Subject to any disclaimer, the term of this patent is extended or adjusted under 35 U.S.C. 154(b) by 171 days.

(21) Appl. No.: 16/609,381

(22) PCT Filed: Nov. 29, 2018

(86) PCT No.: PCT/KR2018/014977
§ 371 (c)(1),
(2) Date: Oct. 29, 2019

(87) PCT Pub. No.: WO2019/107976
PCT Pub. Date: Jun. 6, 2019

(65) Prior Publication Data
US 2020/0049770 A1    Feb. 13, 2020

(30) Foreign Application Priority Data

Nov. 29, 2017 (KR) .......................... 10-2017-0162223

(51) Int. Cl.
*H02J 7/00* (2006.01)
*G01R 31/364* (2019.01)
(Continued)

(52) U.S. Cl.
CPC .......... *G01R 31/364* (2019.01); *H01M 10/44* (2013.01); *H01M 10/46* (2013.01); *H01M 10/48* (2013.01); *H02J 7/0021* (2013.01); *H02J 7/0045* (2013.01)

(58) Field of Classification Search
USPC .......................... 320/108, 110, 111, 112, 114
See application file for complete search history.

(56) References Cited

U.S. PATENT DOCUMENTS

2002/0070608 A1    6/2002 Matsuki et al.
2007/0221627 A1    9/2007 Yugou et al.
(Continued)

FOREIGN PATENT DOCUMENTS

CN    105109347 A  * 12/2015
CN    207924092 U  *  9/2018
(Continued)

OTHER PUBLICATIONS

International Search Report in International Application No. PCT/KR2018/014977, dated Mar. 20, 2019, 2 pages.
(Continued)

*Primary Examiner* — Brian Ngo
(74) *Attorney, Agent, or Firm* — Lerner, David, Littenberg, Krumholz & Mentlik, LLP

(57) ABSTRACT

A battery pack including first and second battery contactors respectively having first ends electrically connected to positive and negative electrode terminals of a battery; first and second charging contactors respectively having first ends electrically connected to second ends of the first and second battery contactors; a second power connector of a charger having first and second output terminals respectively electrically connected to the first and second input terminals being connected to the first power connector; and a control unit configured to, when a second power connector of a charger is electrically connected to the first power connector, receive a charging end request signal from the charger, control changes of the first and second charging contactors between turn-on and turn-off states, and diagnose a fault of each of the first and second charging contactors based on first, second or third measured voltages across the first, second or third resistors, respectively.

7 Claims, 8 Drawing Sheets

(51) Int. Cl.
*H01M 10/44* (2006.01)
*H01M 10/46* (2006.01)
*H01M 10/48* (2006.01)

(56) References Cited

U.S. PATENT DOCUMENTS

| | | |
|---|---|---|
| 2012/0191294 A1 | 7/2012 | Boiron et al. |
| 2012/0268068 A1 | 10/2012 | Jung et al. |
| 2013/0320986 A1 | 12/2013 | Shiraishi et al. |
| 2015/0077124 A1 | 3/2015 | Suzuki |
| 2016/0272070 A1 | 9/2016 | Kojima |
| 2017/0028857 A1 | 2/2017 | Gonzales et al. |
| 2017/0244239 A1 | 8/2017 | Jin et al. |
| 2018/0188326 A1* | 7/2018 | Huh ................ G01R 19/16571 |

FOREIGN PATENT DOCUMENTS

| | | |
|---|---|---|
| DE | 102011004516 A1 | 8/2012 |
| DE | 102015008467 A1 | 1/2016 |
| JP | 2002175750 A | 6/2002 |
| JP | 2007114173 A * | 5/2007 |
| JP | 2007240300 A * | 9/2007 |
| JP | 2007285969 A | 11/2007 |
| JP | 2009136110 A | 6/2009 |
| JP | 2011166950 A | 8/2011 |
| JP | 4996190 B2 | 8/2012 |
| JP | 2013500548 A | 1/2013 |
| JP | 2013516954 A | 5/2013 |
| JP | 2015095934 A | 5/2015 |
| JP | 2015230784 A | 12/2015 |
| JP | 2016090366 A | 5/2016 |
| JP | 2016174468 A | 9/2016 |
| JP | 2016219229 A | 12/2016 |
| JP | 2017120191 A | 7/2017 |
| JP | 2017125417 A | 7/2017 |
| JP | 2017175790 A | 9/2017 |
| KR | 20130051228 A | 5/2013 |
| KR | 20140020765 A | 2/2014 |
| KR | 20140072489 A | 6/2014 |
| KR | 101716886 B1 | 3/2017 |
| KR | 20170098049 A | 8/2017 |
| KR | 20170099672 A | 9/2017 |

OTHER PUBLICATIONS

Extended European Search Report including Written Opinion for EP18884733.9 dated May 12, 2020; 9 pages.

* cited by examiner

BATTERY PACK

CROSS-REFERENCE TO RELATED APPLICATIONS

The present application is a national phase entry under 35 U.S.C. í 371 of International Application No. PCT/KR2018//014977 filed Nov. 29, 2018, published in Korean, which claims priority from Korean Patent Application No. 10-2017-0162223 filed Nov. 29, 2017, all of which are incorporated herein by reference.

TECHNICAL FIELD

The present disclosure relates to a battery pack, and more particularly, to a battery pack for diagnosing a fault of a charging contactor based on a voltage applied to a measurement resistor connected to the charging contactor.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance secondary batteries allowing repeated charging and discharging are being actively studied.

Secondary batteries commercially available at the present include nickel-cadmium batteries, nickel hydrogen batteries, nickel-zinc batteries, lithium secondary batteries and the like. Among them, the lithium secondary batteries are in the limelight since they have al most no memory effect compared to nickel-based secondary batteries and also have very low self-discharging rate and high energy density.

In particular, the battery pack includes a battery module in which a plurality of battery cells are electrically connected, thereby meeting a high-capacity and high-power design required for an electric vehicle. The battery pack applied to an electric vehicle may be electrically connected to a charger of a charging station to charge the electric power.

To this end, the battery pack applied to an electric vehicle may include a battery contactor connected to a positive electrode terminal and a negative electrode terminal of the battery module to control the electrical connection of the output terminals of the battery module, and a charging contactor for controlling the electrical connection between the battery contactor and a charging terminal to which the power of the charger is input.

In particular, it is important that the charging contactor is exposed to the outside and also controls the electrical connection of an input terminal connected to a power connector of the charger in order to monitor whether the charging contactor is currently in a turn-on state or a turn-off state and to determine whether the charging contactor is actually controlled in response to the control to the turn-on state or the turn-off state.

DISCLOSURE

Technical Problem

The present disclosure is directed to providing a battery pack, which may determines a turn-off fault of each of a first charging contactor and a second charging contactor after controlling the first charging contactor and the second charging contactor into a turn-off state in order, when a charging end request signal is received since the charging is completed or stopped in a state where a first power connector of the battery pack is connected to a second power connector of a charger.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a battery pack, comprising: a first battery contactor, wherein a first end of the first battery connector is configured to be electrically connected to a positive electrode terminal of a battery, a second battery contactor, wherein a first end of the second battery connector is configured to be electrically connected to a negative electrode terminal of the battery; a first charging contactor, wherein a first end of the first charging contactor is electrically connected to a second end of the first battery contactor, a second charging contactor, wherein a first end of the second charging contactor is electrically connected to a second end of the second battery contactor; a first measurement resistor electrically connected between a first node located at the first end of the second charging contactor and a second node located at the first end of the first charging contactor, a second measurement resistor electrically connected between the first node and a third node located at a second end of the first charging contactor, and a third measurement resistor electrically connected between the first node and a fourth node located at a second end of the second charging contactor; a first power connector having a first input terminal electrically connected to the second end of the first charging contactor and a second input terminal electrically connected to the second end of the second charging contactor; and a control unit configured to, when first and second output terminals of a second power connector of a charger are respectively electrically connected to the first input terminal and the second input terminal of the first power connector, respectively, receive a charging end request signal from the charger, control changes of the first charging contactor and the second charging contactor between a turn-on state and a turn-off state in order, and diagnose a fault of each of the first charging contactor and the second charging contactor based on at least one of a first measured voltage measured across the first measurement resistor, a second measured voltage measured across the second measurement resistor or a third measured voltage measured across the third measurement resistor.

Preferably, the control unit may be configured to control the second charging contactor to change from the turn-on state to the turn-off state and determine a turn-off fault of the second charging contactor based on the third measured voltage that is measured while the second charging contactor is in the turn-off state.

Preferably, when the third measured voltage is less than a second reference voltage, the control unit may be configured to determine that a turn-off fault occurs at the second charging contactor.

Preferably, the control unit may be configured to diagnose a fault of the second charging contactor based on the third measured voltage, control the first charging contactor to change from the turn-on state into the turn-off state, and determine a turn-off fault of the first charging contactor based on a measured voltage difference between the first measured voltage and the second measured voltage that are measured while the first charging contactor is in the turn-off state.

Preferably, when the measured voltage difference between the first measured voltage and the second measured voltage is smaller than a first reference voltage, the control unit may be configured to determine that a turn-off fault occurs at the first charging contactor.

Preferably, when it is determined that a fault occurs in at least one of the first charging contactor and the second charging contactor, the control unit may be configured to output a fault signal.

In another aspect of the present disclosure, there is also provided a vehicle, comprising the battery pack of any of the embodiments described herein.

Advantageous Effects

According to at least one of embodiments of the present disclosure, it is possible to prevent an electric accident, which may occur since each of the first charging contactor and the second charging contactor maintains its turn-on state after the charging is completed, by determining a turn-off fault of each of the first charging contactor and the second charging contactor and notifying the determined result to the outside.

The effects of the present disclosure are not limited to the above, and other effects not mentioned herein may be clearly understood by those skilled in the art from the appended claims.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

DETAILED DESCRIPTION

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as 'first_, 'second_ and the like, may be used to distinguish one element from another among various elements, but not intended to limit the elements by the terms.

Throughout the specification, when a portion is referred to as 'comprising_ or 'including_any element, it means that the portion may include other elements further, without excluding other elements, unless specifically stated otherwise. Furthermore, the term 'control unit_described in the specification refers to a unit that processes at least one function or operation, and may be implemented by hardware, software, or a combination of hardware and software.

In addition, throughout the specification, when a portion is referred to as being 'connected_to another portion, it is not limited to the case that they are 'directly connected_, but it also includes the case where they are 'indirectly connected_with another element being interposed between them.

Hereinafter, a battery pack 100 device according to an embodiment of the present disclosure will be described.

FIGS. 1 to 4 are diagrams showing a functional configuration of the battery pack 100 according to an embodiment of the present disclosure and a charger CS.

Figure 1:
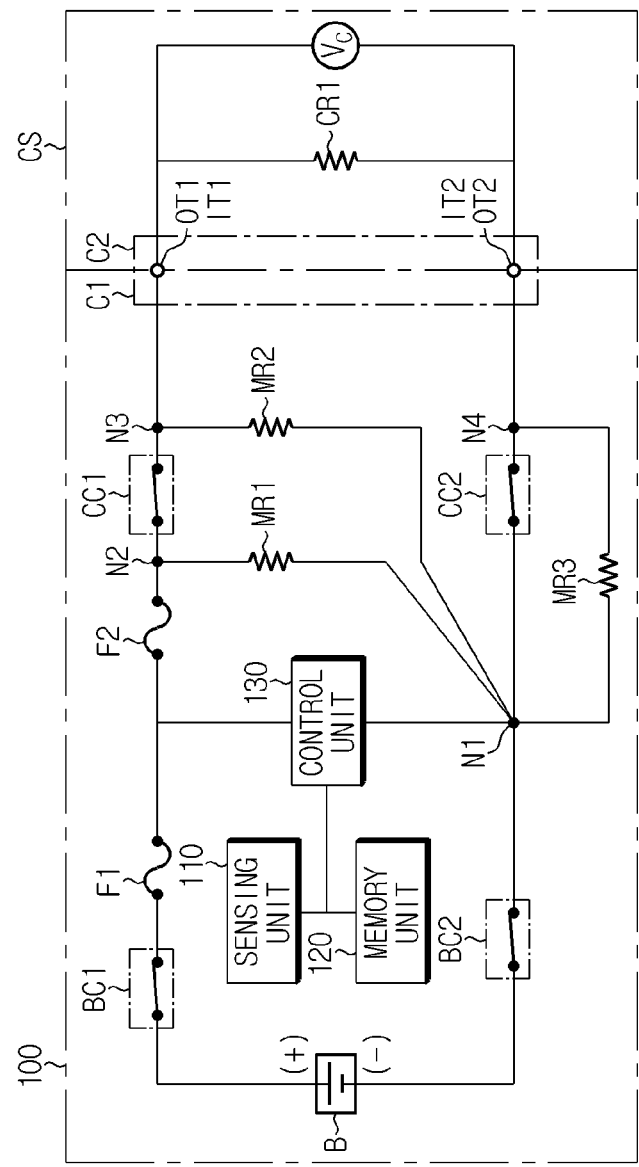
FIGS. 1 to 4 are diagrams showing a functional configuration of a battery pack according to an embodiment of the present disclosure and a charger.

First, referring to FIG. 1, the battery pack 100 includes a battery module B, a first battery contactor BC1, a second battery contactor BC2, a first charging contactor CC1, a second charging contactor CC2, a first measurement resistor MR1, a second measurement resistor MR2, a third measurement resistor MR3, a first power connector C1, a sensing unit 110, a memory unit 120 and a control unit 130.

The battery module B may include at least one battery cell. If the battery module B includes a plurality of battery cells electrically connected, the plurality of battery cells may be connected to each other in series, in parallel or in series and parallel. The battery module B has a positive electrode terminal (+) and a negative electrode terminal (−).

One end of the first battery contactor BC1 is electrically connected to the positive electrode terminal (+) of the battery module B, and one end of the second battery contactor BC2 is electrically connected to the negative electrode terminal (−) of the battery module B.

By doing so, the battery module B may output power or be charged according to a turn-on state or a turn-off state of the first battery contactor BC1 and the second battery contactor BC2.

The first battery contactor BC1 and the second battery contactor BC2 may be controlled into a turn-on state or a turn-off state by the control unit 130, explained later.

Here, the turn-on state means a state where a contact point of the contactor is in contact to make one end and the other end of the contactor be electrically connected. Also, the turn-off state means a state where the contact point of the contactor is separated to make one end and the other end of the contactor be electrically disconnected.

One end of the first charging contactor CC1 is electrically connected to the other end of the first battery contactor BC1, and one end of the second charging contactor CC2 is electrically connected to the other end of the second battery contactor BC2.

In addition, the other ends of the first charging contactor CC1 and the second charging contactor CC2 are electrically connected to the first power connector C1, respectively. More specifically, the other end of the first charging contactor CC1 is electrically connected to a first input terminal IT1 provided at the first power connector C1, and the other end of the second charging contactor CC2 is electrically connected to a second input terminal IT2 provided at the first power connector C1.

Meanwhile, if a second power connector C2 of the charger CS is connected to the first power connector C1, a first output terminal OT1 and a second output terminal OT2 of the second power connector C2 may be electrically connected to the first input terminal IT1 and the second input terminal IT2, respectively.

Accordingly, when the first battery contactor BC1, the second battery contactor BC2, the first charging contactor CC1 and the second charging contactor CC2 are in a turn-on state, if the second power connector C2 is connected to the first power connector C1, the power of the charger CS is supplied to charge the battery module B.

Meanwhile, a second node N2 and a third node N3 are located at one end and the other end of the first charging contactor CC1, respectively, and a first node N1 and a fourth node N4 are located at one end and the other end of the second charging contactor CC2, respectively.

At this time, the first measurement resistor MR1 is electrically connected between the first node N1 and the second node N2, and the second measurement resistor MR2 is electrically connected between the first node N1 and the third node N3. Also, the third measurement resistor MR3 is electrically connected between the first node N1 and the fourth node N4 and connected to the second charging contactor CC2 in parallel.

The sensing unit 110 is operatively coupled to the control unit 130. That is, the sensing unit 110 may be connected to the control unit 130 to transmit an electrical signal to the control unit 130 or to receive an electrical signal from the control unit 130.

The sensing unit 110 measures a battery voltage applied between the positive electrode terminal (+) and the negative electrode terminal (−) of the battery module B according to a preset cycle or the sensing control of the control unit 130.

Also, the sensing unit 110 measures a first measurement voltage, a second measurement voltage and a third measurement voltage applied to the first measurement resistor MR1, the second measurement resistor MR2 and the third measurement resistor MR3, respectively, according to the preset cycle or the sensing control of the control unit 130.

In addition, the sensing unit 110 measures a charging voltage Vc of the charger CS applied between the first input terminal IT1 and the second input terminal IT2 or between the first output terminal OT1 and the second output terminal OT2 according to the preset cycle or the sensing control of the control unit 130.

Also, the sensing unit 110 repeatedly measures the battery current flowing into or out of the battery module B.

After that, the sensing unit 110 may provide the measured signal representing the measured battery voltage, the first measurement voltage, the second measurement voltage, the third measurement voltage, the charging voltage Vc and the battery current to the control unit 130.

To this end, the sensing unit 110 includes a voltage sensor configured to measure the voltage of the battery module B. In addition, the sensing unit 110 may further include a current sensor configured to measure the current of the battery module B.

If the measured signal is received from the sensing unit 110, the control unit 130 may determine a digital value of each of the measured battery voltage, the first measurement voltage, the second measurement voltage, the third measurement voltage, the charging voltage Vc and the battery current, respectively, and store the digital value in the memory unit 120.

The memory unit 120 is a semiconductor memory device that records, erases and updates data generated by the control unit 130, and stores a plurality of program codes for diagnosing faults of the first charging contactor CC1 and the second charging contactor CC2, respectively. In addition, the memory unit 120 may store settings used when the present disclosure is implemented.

The memory unit 120 is not particularly limited as long as it is a semiconductor memory device known to be capable of recording, erasing and updating data. As one example, the memory unit 120 may be a dynamic random-access memory (DRAM), a synchronous dynamic random-access memory (SDRAM), a flash memory, a read-only memory (ROM), an electrically erasable programmable read-only memory (EEPROM), a register, or the like. The memory unit 120 may further include a storage medium storing program codes that define the control logic of the control unit 130. The storage medium includes a non-volatile storage element such as a flash memory or a hard disk. The memory unit 120 may be physically separated from the control unit 130 or may be integrated with the control unit 130.

The control unit 130 determines whether to perform a fault diagnosis of the first charging contactor CC1 and the second charging contactor CC2 based on a diagnosis condition.

Here, the diagnosis condition may include any one of whether the first power connector C1 and the second power connector C2 are coupled, whether the charging end request signal is received, and whether the first battery contactor BC1 and the second battery contactor BC2 are in a turn-on state.

Here, the charging end request signal may be a signal output from an electronic control unit (ECU) of a vehicle including the battery pack according to the present disclosure.

As shown in FIG. 1, the control unit 130 according to an embodiment determines that the diagnosis condition is satisfied if the first power connector C1 and the second power connector C2 are combined, the charging end request signal is received, and the first battery contactor BC1 and the second battery contactor BC2 are in the turn-on state.

Meanwhile, if the charging end request signal is received, the control unit 130 outputs an output end signal to the charger CS so that the charging voltage Vc of the charger CS is not applied between the first output terminal OT1 and the second output terminal OT2.

If the diagnosis condition is satisfied, the control unit 130 determines that the first charging contactor CC1 and the second charging contactor CC2 are to be diagnosed. After that, the control unit 130 controls at least one of the first charging contactor CC1 and the second charging contactor CC2 into a turn-on state or a turn-off state and determines whether a fault occurs at each of the first charging contactor CC1 and the second charging contactor CC2 based on at least one of the first measured voltage, the second measured voltage and the third measured voltage measured according to the above control.

To this end, the control unit 130 is configured to generate a control signal for controlling at least one of the first battery contactor BC1, the second battery contactor BC2, the first charging contactor CC1 and the second charging contactor CC2 into a turn-on state or a turn-off state.

Figure 2:
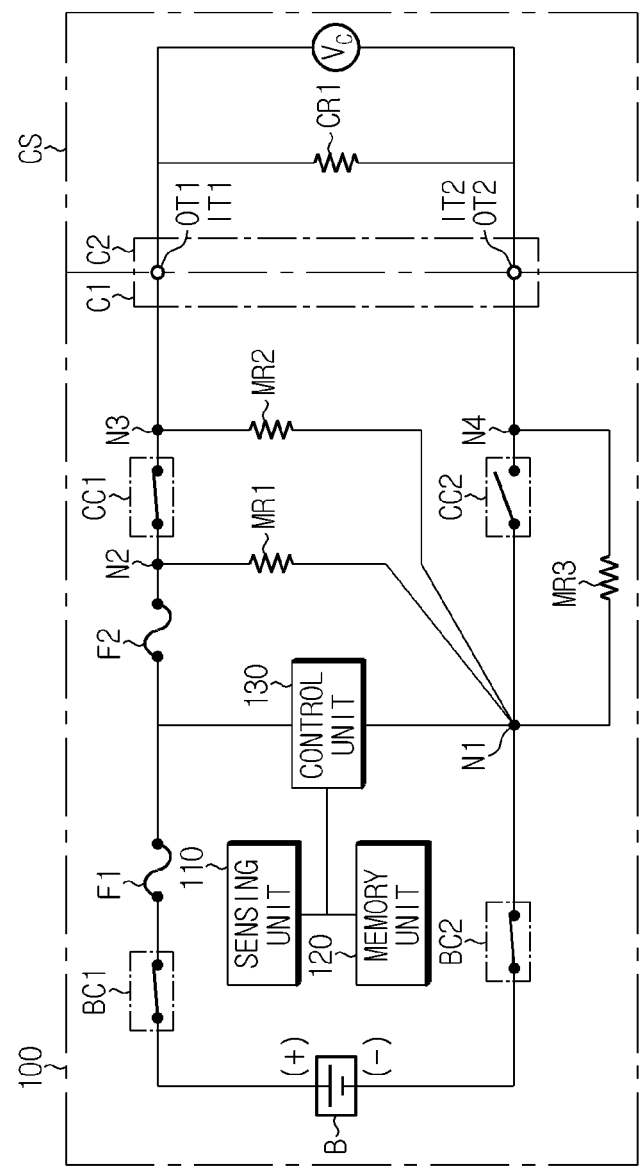

First, the control unit 130 controls only the second charging contactor CC2 into a turn-off state among the first charging contactor CC1 and the second charging contactor CC2 as shown in FIG. 2 and determines whether the second charging contactor CC2 has a turn-off fault based on the third measured voltage.

Here, the turn-off fault may mean a fault that a contactor maintains a turn-on state even though the control unit 130 controls the contactor to turn off.

If the third measured voltage is less than a second reference voltage, the control unit 130 may determine that a turn-off fault has occurred at the second charging contactor CC2.

Conversely, if the third measured voltage is equal to or greater than the second reference voltage, the control unit 130 determines that a turn-off fault has not occurred at the second charging contactor CC2.

Meanwhile, the control unit 130 calculates a theoretical value of the third measured voltage corresponding to the case where the connector condition is a first connector condition in which the second power connector C2 having the first output terminal OT1 and the second output terminal OT2 to which the charging voltage Vc is not applied is coupled to the first power connector C1 and the contactor condition is a first contactor condition in which the first battery contactor BC1 and the second battery contactor BC2 are in a turn-on state, the first charging contactor CC1 is in a turn-on state and the second charging contactor CC2 is in a turn-off state.

More specifically, the control unit 130 calculates an internal resistance CR1 of the charger CS by using the battery current and the voltage applied between the first input terminal IT1 and the second input terminal IT2, and calculates a theoretical value of the third measured voltage at the first connector condition and the first contactor condition by computing a distribution voltage of the charging voltage Vc and a battery voltage between the first measurement resistor MR1, the second measurement resistor MR2, the third measurement resistor MR3, the insulation resistance of the battery pack 100, and the internal resistance CR1 of the charger CS.

In addition, the control unit 130 calculates a theoretical value of the third measured voltage corresponding to the case where the connector condition is a second connector condition in which the second power connector C2 having the first output terminal OT1 and the second output terminal OT2 to which the charging voltage Vc is applied is coupled to the first power connector C1 and the contactor condition is the first contactor condition described above.

More specifically, the control unit 130 calculates the internal resistance CR1 of the charger CS by using the battery current and the voltage applied between the first input terminal IT1 and the second input terminal IT2, and calculates a theoretical value of the third measured voltage at the second connector condition and the first contactor condition by computing a distribution voltage of the charging voltage Vc and a battery voltage between the first measurement resistor MR1, the second measurement resistor MR2, the third measurement resistor MR3, the insulation resistance of the battery pack 100, and the internal resistance CR1 of the charger CS.

After that, the control unit 130 sets the second reference voltage to be less than the calculated theoretical value of the third measured voltage.

By doing so, the control unit 130 sets the second reference voltage corresponding to the insulation resistance of the battery pack 100 and the internal resistance CR1 of the charger CS connected to the battery pack 100, thereby accurately diagnosing a failure of the second charging contactor CC2.

If a turn-off fault of the second charging contactor CC2 is determined, the control unit 130 outputs a fault signal to notify the turn-off fault of the second charging contactor CC2 to the outside.

Figure 3:
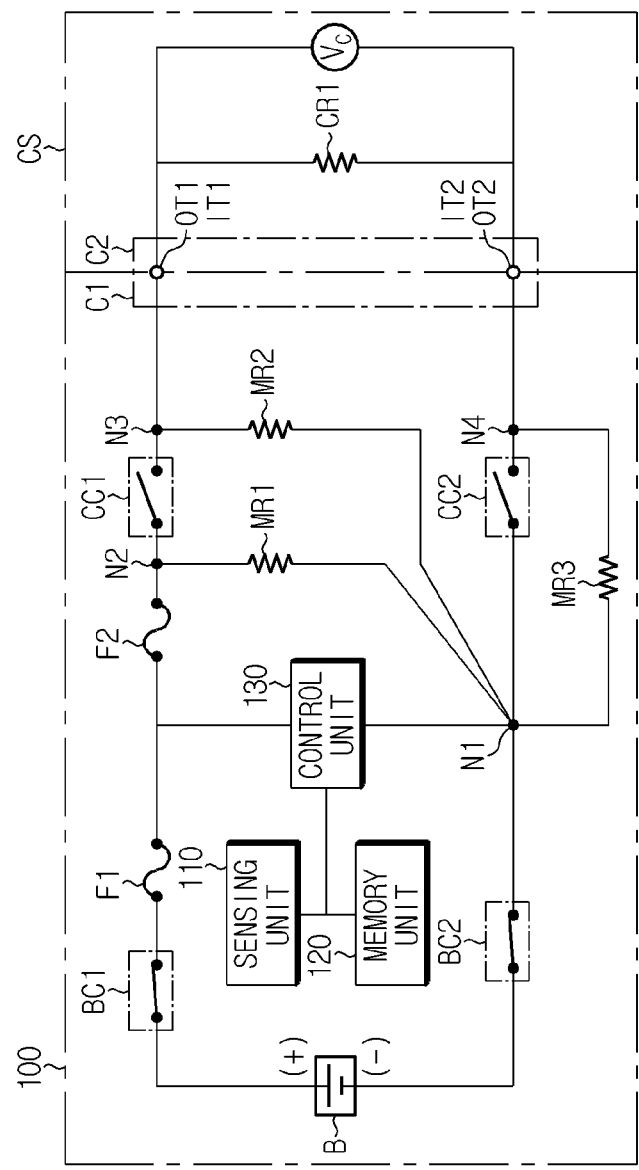

Meanwhile, if a turn-off fault has not occurred at the second charging contactor CC2, in order to determine a turn-off fault of the first charging contactor CC1, as shown in FIG. 3, the first charging contactor CC1 is controlled into the turn-off state without controlling the second charging contactor CC2 that is in the turn-off state.

At this time, the control unit 130 controls only the first charging contactor CC1 into the turn-off state among the first charging contactor CC1 in the turn-on state and the second charging contactor CC2 in the turn-off state, and determines whether the first charging contactor CC1 has a turn-off fault based on the measured voltage difference between the first measured voltage and the second measured voltage.

If the measured voltage difference is smaller than the first reference voltage, the control unit 130 determines that a turn-off fault has occurred at the first charging contactor CC1.

Conversely, if the measured voltage difference is equal to or greater than the first reference voltage, the control unit 130 determines that a turn-off fault has not occurred at the first charging contactor CC1.

Meanwhile, the control unit 130 calculates a theoretical value of the measured voltage difference between the first measured voltage and the second measured voltage corresponding to the case where the connector condition is the first connector condition described above and the contactor condition is a second contactor condition in which the first battery contactor BC1 and the second battery contactor BC2 are in the turn-on state and the first charging contactor CC1 and the second charging contactor CC2 are in the turn-off state.

More specifically, the control unit 130 calculates a theoretical value of the measured voltage difference between the first measured voltage and the second measured voltage in the first connector condition and the second contactor condition by calculating the internal resistance CR1 of the charger CS using the battery current and the voltage applied between the first input terminal IT1 and the second input terminal IT2 and calculating the distribution voltage of the charging voltage V c and the battery voltage between the first measurement resistor MR1, the second measurement resistor MR2, the third measurement resistor MR3, the insulation resistance of the battery pack 100, and the internal resistance CR1 of the charger CS.

In addition, the control unit 130 calculates a theoretical value of the measured voltage difference between the first measured voltage and the second measured voltage corresponding to the case where the connector condition is the second connector condition described above and the contactor condition corresponds to the second contactor condition described above.

More specifically, the control unit 130 calculates a theoretical value of the measured voltage difference between the first measured voltage and the second measured voltage in the second connector condition and the second contactor condition by calculating the internal resistance CR1 of the charger CS using the battery current and the voltage applied between the first input terminal IT1 and the second input terminal IT2 and calculating a distribution voltage of the charging voltage Vc and the battery voltage between the first measurement resistor MR1, the second measurement resistor MR2, the third measurement resistor MR3, the insulation resistance of the battery pack 100, and the internal resistance CR1 of the charger CS.

After that, the control unit 130 sets the first reference voltage to be less than the calculated theoretical value of the measured voltage difference between the first measured voltage and the second measured voltage.

By doing so, the control unit 130 sets the first reference voltage corresponding to the insulation resistance of the battery pack 100 and the internal resistance CR1 of the charger CS connected to the battery pack 100, thereby diagnosing a failure of the first charging contactor CC1 accurately.

If a turn-off fault of the first charging contactor CC1 is determined, the control unit 130 outputs a fault signal to notify the failure of the first charging contactor CC1 to the outside.

Figure 4:
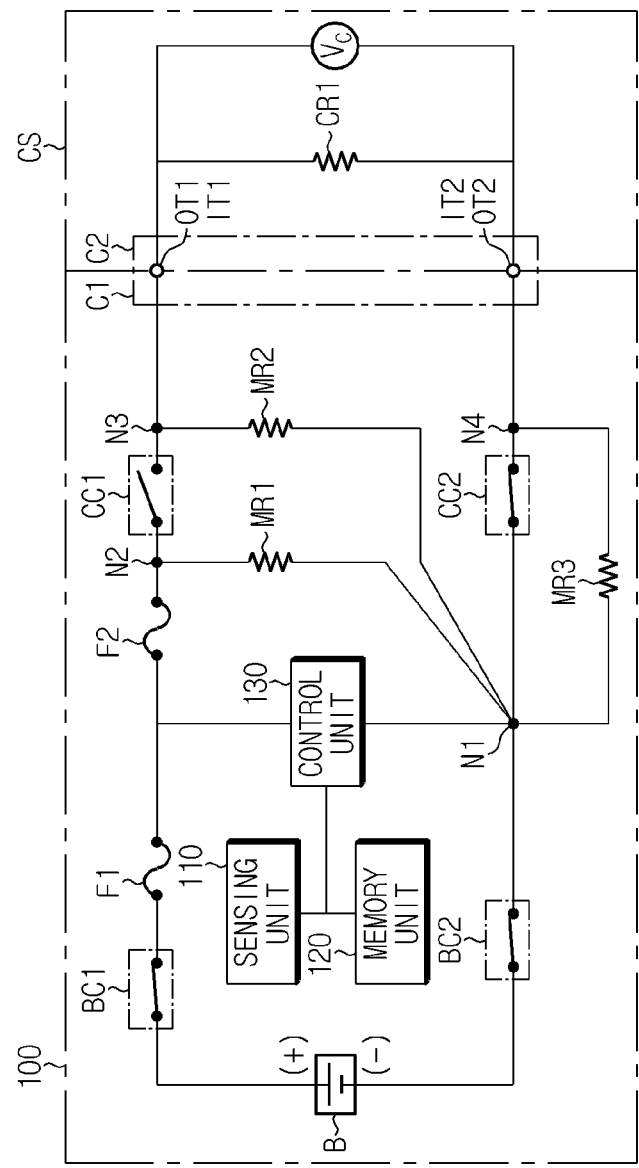

Meanwhile, if a turn-off fault occurs at the second charging contactor CC2, as shown in FIG. 4, the second charging contactor CC2 maintains the turn-on state without being controlled into the turn-off state.

At this time, the control unit 130 controls the first charging contactor CC1, which is a turn-on state, into the turn-off state without controlling the second charging contactor CC2, which is the turn-on state since a turn-off fault occur, and determines whether a turn-off fault occurs at the first charging contactor CC1 based on the measured voltage difference between the first measured voltage and the second measured voltage.

More specifically, if the measured voltage difference between the first measured voltage and the second measured voltage is smaller than the first reference voltage, the control unit 130 determines that a turn-off fault has occurred at the first charging contactor CC1.

Conversely, if the measured voltage difference is equal to or greater than the first reference voltage, the control unit 130 determines that a turn-off fault has not occurred at the first charging contactor CC1.

At this time, the control unit 130 calculates a theoretical value of the measured voltage difference between the first measured voltage and the second measured voltage corresponding to the case where that the connector condition is the first connector condition described above and the contactor condition is a third contactor condition in which the first battery contactor BC1 and the second battery contactor BC2 are in the turn-on state and the first charging contactor CC1 is in the turn-off state and the second charging contactor CC2 are in the turn-on state.

More specifically, the control unit 130 calculates a theoretical value of the measured voltage difference between the first measured voltage and the second measured voltage in the first connector condition and the third contactor condition by calculating the internal resistance CR1 of the charger CS using the battery current and the voltage applied between the first input terminal IT1 and the second input terminal IT2 and calculating a distribution voltage of the charging voltage Vc and the battery voltage between the first measurement resistor MR1, the second measurement resistor MR2, the third measurement resistor MR3, the insulation resistance of the battery pack 100, and the internal resistance CR1 of the charger CS.

In addition, the control unit 130 calculates a theoretical value of the measured voltage difference between the first measured voltage and the second measured voltage corresponding to the case where the connector condition is the second connector condition described above and the contactor condition corresponds to the third contactor condition described above.

More specifically, the control unit 130 calculates a theoretical value of the measured voltage difference between the first measured voltage and the second measured voltage in the second connector condition and the third contactor condition by calculating the internal resistance CR1 of the charger CS using the battery current and the voltage applied between the first input terminal IT1 and the second input terminal IT2 and calculating a distribution voltage of the charging voltage Vc and battery voltage between the first measurement resistor MR1, the second measurement resistor MR2, the third measurement resistor MR3, the insulation resistance of the battery pack 100, and the internal resistance CR1 of the charger CS.

After that, the control unit 130 sets the first reference voltage to be less than the calculated theoretical value of the measured voltage difference between the first measured voltage and the second measured voltage.

By doing so, even if a turn-off fault occurs at the second charging contactor CC2, the control unit 130 determines whether a turn-off fault has occurred at the first charging contactor CC1, based on the measured voltage difference between the first measured voltage and the second measured voltage.

If it is determined that a turn-off fault has occurred at the first charging contactor CC1, the control unit 130 outputs a fault signal to notify the failure of the first charging contactor CC1 to the outside.

Meanwhile, the control unit 130 may selectively include a processor, an application-specific integrated circuit (ASIC), another chipset, a logic circuit, a register, a communication modem, a data processing device or the like in order to execute various control logics. At least one of the various control logics executable by the control unit 130 may be combined, and the combined control logic is written in a computer-readable code system and recorded on a computer-readable recording medium. The recording medium has no limitation as long as it can be accessed by the processor included in a computer. As one example, the recording medium includes at least one selected from the group consisting of a ROM, a RAM, a register, a CD-ROM, a magnetic tape, a hard disk, a floppy disk and an optical data recording device.

Hereinafter, a battery pack 100˘ according to another embodiment of the present disclosure will be described. In the battery pack 100˘ according to another embodiment of the present disclosure, some components may be further included and some components may have different functions, compared to the battery pack 100˘ according to the former embodiment of the present disclosure. Accordingly, the same features will not be described again.

Figure 5:
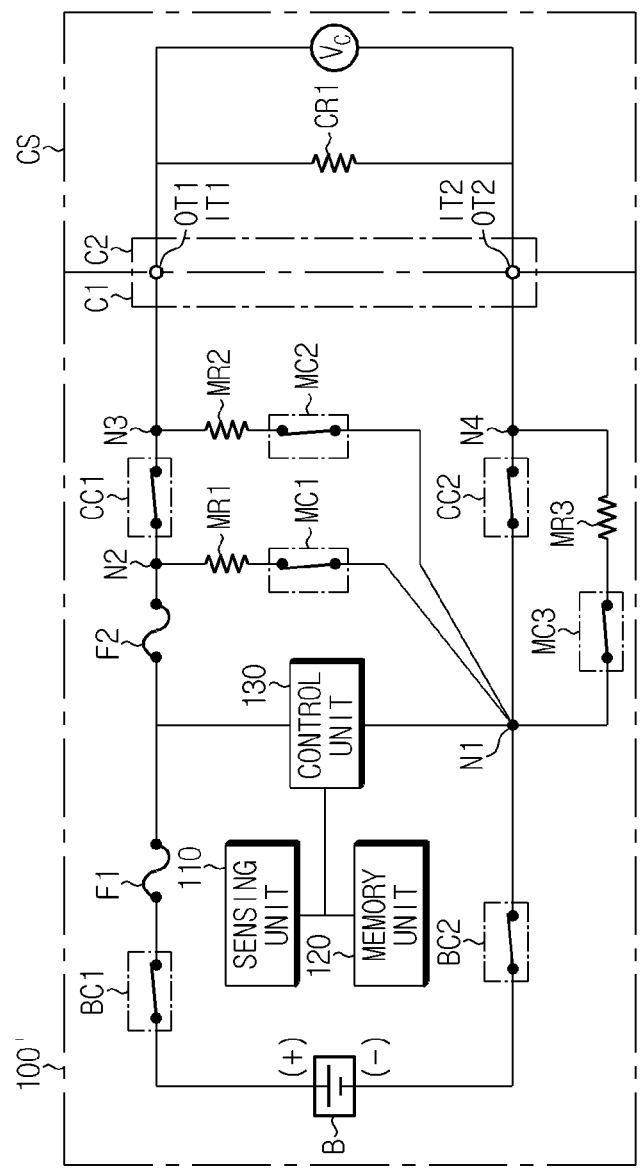
FIG. 5 is a diagram showing a functional configuration of a battery pack according to another embodiment of the present disclosure in a state where the battery pack is coupled to a charger.
Figure 6:
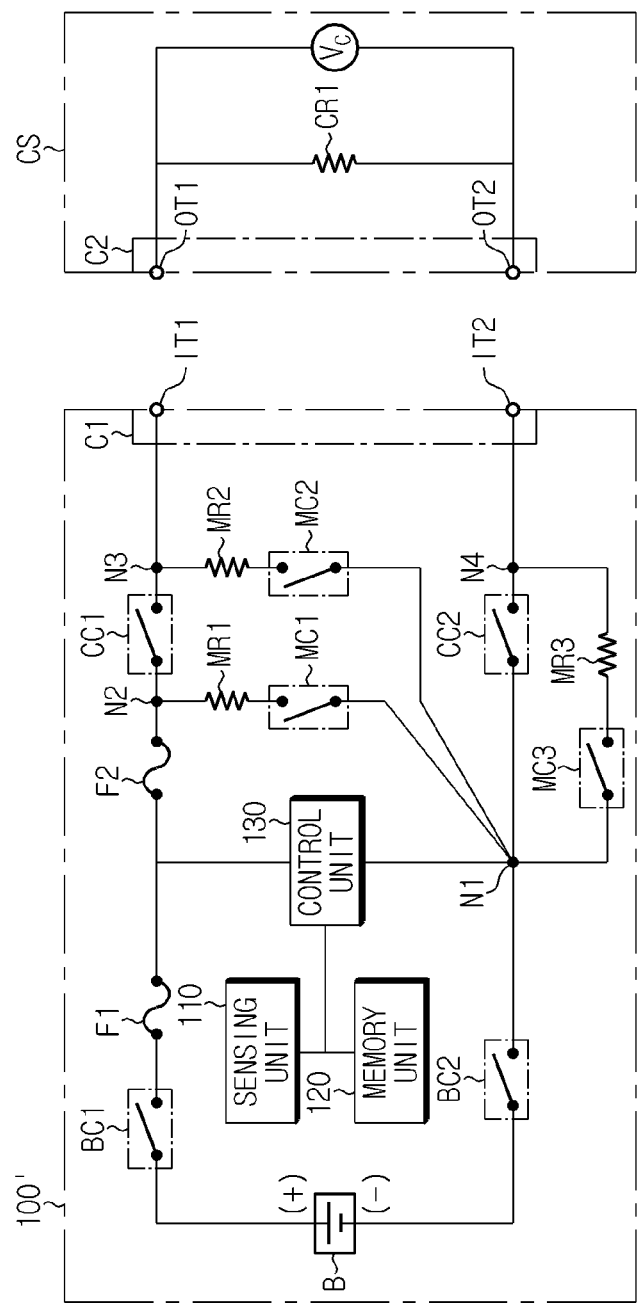
FIG. 6 is a diagram showing a functional configuration of the battery pack according to another embodiment of the present disclosure in a state where the battery pack is separated from the charger.

FIG. 5 is a diagram showing a functional configuration of the battery pack 100˘ according to another embodiment of the present disclosure in a state where the battery pack 100˘ is coupled to a charger CS, and FIG. 6 is a diagram showing a functional configuration of the battery pack 100˘ according to another embodiment of the present disclosure in a state where the battery pack 100˘ is separated from the charger CS.

Referring to FIG. 5, the battery pack 100˘ according to another embodiment of the present disclosure may further include a first measurement contactor MC1, a second measurement contactor MC2 and a third measurement contactor MC3, compared to the battery pack 100 according to the former embodiment of the present disclosure.

The first measurement contactor MC1 is electrically connected between the first measurement resistor MR1 and the first node N1. More specifically, one end of the first measurement resistor MR1 is electrically connected to the second node N2, and the other end of the first measurement resistor MR1 is electrically connected to one end of the first measurement contactor MC1. Subsequently, the other end of the first measurement contactor MC1 is electrically connected to the first node N1. That is, the first measurement resistor MR1 and the first measurement contactor MC1 are el electrically connected in series between the first node N1 and the second node N2.

The second measurement contactor MC2 is electrically connected between the second measurement resistor MR2 and the first node N1. More specifically, one end of the second measurement resistor MR2 is electrically connected to the third node N3, and the other end of the second measurement resistor MR2 is electrically connected to one end of the second measurement contactor MC2. Subsequently, the other end of the second measurement contactor MC2 is electrically connected to the first node N1. That is, the second measurement resistor MR2 and the second measurement contactor MC2 are electrically connected in series between the first node N1 and the third node N3.

The third measurement contactor MC3 is electrically connected between the third measurement resistor MR3 and the first node N1. More specifically, one end of the third measurement resistor MR3 is electrically connected to the fourth node N4, and the other end of the third measurement resistor MR3 is electrically connected to one end of the third measurement contactor MC3. Subsequently, the other end of the third measurement contactor MC3 is electrically connected to the first node N1. That is, the third measurement resistor MR3 and the third measurement contactor MC3 are electrically connected in series between the first node N1 and the fourth node N4.

The measurement resistors MR1, . . . , MR3 described above may be resistors used to measure the voltage applied to the first charging contactor CC1 and the second charging contactor CC2. The measurement contactors MC1, . . . , MC3 electrically connected to the measurement resistors may serve to conduct or interrupt the current flowing through the measurement resistors.

The control unit 130 controls an operation state of at least one of the first measurement contactor MC1, the second measurement contactor MC2 and the third measurement contactor MC3 based on whether at least one of a charging start request signal and a charging end request signal is received.

Here, the charging start request signal and the charging end request signal may be signals output from an ECU of a vehicle that includes the battery pack according to the present disclosure.

In addition, if the charging start request signal is outputted from the ECU of the vehicle, as shown in FIG. 5, the first power connector C1 and the second power connector C2 of the charger CS may be in a coupled state in order to initiate charging.

If the charging start request signal is received, firstly, the control unit 130 controls the operation states of the first measurement contactor MC1, the second measurement contactor MC2 and the third measurement contactor MC3 to turn on. After that, the control unit 130 controls the operating states of the first charging contactor CC1 and the second charging contactor CC2 to turn on.

That is, if the charging start request signal is received, the control unit 130 controls the operation states of the first measurement contactor MC1, the second measurement contactor MC2 and the third measurement contactor MC3 to turn on before the operation states of the first charging contactor CC1 and the second charging contactor CC2 come into the turn-on state.

By doing so, the control unit 130 may monitor the voltage applied to the first charging contactor CC1 and the second charging contactor CC2 before a charging current is applied from the charger CS to the first charging contactor CC1 and the second charging contactor CC2.

Meanwhile, if the charging end request signal is output from an ECU of a vehicle, charging may be completed so that the first power connector C1 and the second power connector C2 of the charger CS may be in a state just before being separated.

Accordingly, if the charging end request signal is received, the control unit 130 receives firstly controls the operation state of the first charging contactor CC1 to turn off. After that, the control unit 130 controls the operation states of the first measurement contactor MC1 and the second measurement contactor MC2 based on a measurement voltage difference between the first measurement voltage and the second measurement voltage applied to the first measurement resistor MR1 and the second measurement resistor MR2, respectively.

More specifically, if the measurement voltage difference between the first measurement voltage and the second measurement voltage is equal to or greater than a preset first control voltage, the control unit 130 controls the operation states of the first measurement contactor MC1 and the second measurement contactor MC2 to turn off.

That is, if the charging end request signal is received, the control unit 130 controls the operation state of the first charging contactor CC1 to turn off, and if the operation state of the first charging contactor CC1 is controlled to turn off, the control unit 130 controls the operation states of the first measurement contactor MC1 and the second measurement contactor MC2 to turn off.

At this time, if the measurement voltage difference between the first measurement voltage and the second measurement voltage is equal to or greater than the preset first control voltage, the control unit 130 may control only the operation state of the second measurement contactor MC2 to turn off.

In this way, if the first power connector is separated from the second power connector of the charger as the control unit 130 completes charging as shown in FIG. 6, the control unit 130 may control the operation states of the first measurement contactor MC1 and the second measurement contactor MC2 to turn off so that no voltage is applied to the first input terminal IT1, thereby preventing a user from being electrically shocked by the first input terminal IT1 that may be exposed to the outside during the charging process.

Meanwhile, if the charging end request signal is received, the control unit 130 firstly controls the operation state of the second charging contactor CC2 to turn off. After that, the control unit 130 controls the operation state of the third measurement contactor MC3 based on the third measurement voltage applied to the third measurement resistor MR3.

More specifically, if the third measurement voltage is equal to or greater than the preset second control voltage, the control unit 130 controls the operation state of the third measurement contactor MC3 to turn off.

That is, if the charging end request signal is received, the control unit 130 controls the operation state of the second charging contactor CC2 to turn off, and if the operation state of the second charging contactor CC2 is controlled to turn off, the control unit 130 controls the operation state of the third measurement contactor MC3 to turn off.

In this way, if the first power connector is separated from the second power connector of the charger as the control unit 130 completes charging as shown in FIG. 6, the control unit 130 may control the operation state of the third measurement contactor MC3 to turn off so that no voltage is applied to the second input terminal IT2, thereby preventing a user from being electrically shocked by the second input terminal IT2 that may be exposed to the outside during the charging process.

Hereinafter, a battery pack 100_according to still another embodiment of the present disclosure will be described. In the battery pack 100_according to still another embodiment of the present disclosure, some components may be further included and some components may have different functions, compared to the battery pack 100ˇ according to the former embodiment of the present disclosure. Accordingly, the same features will not be described again.

Figure 7:
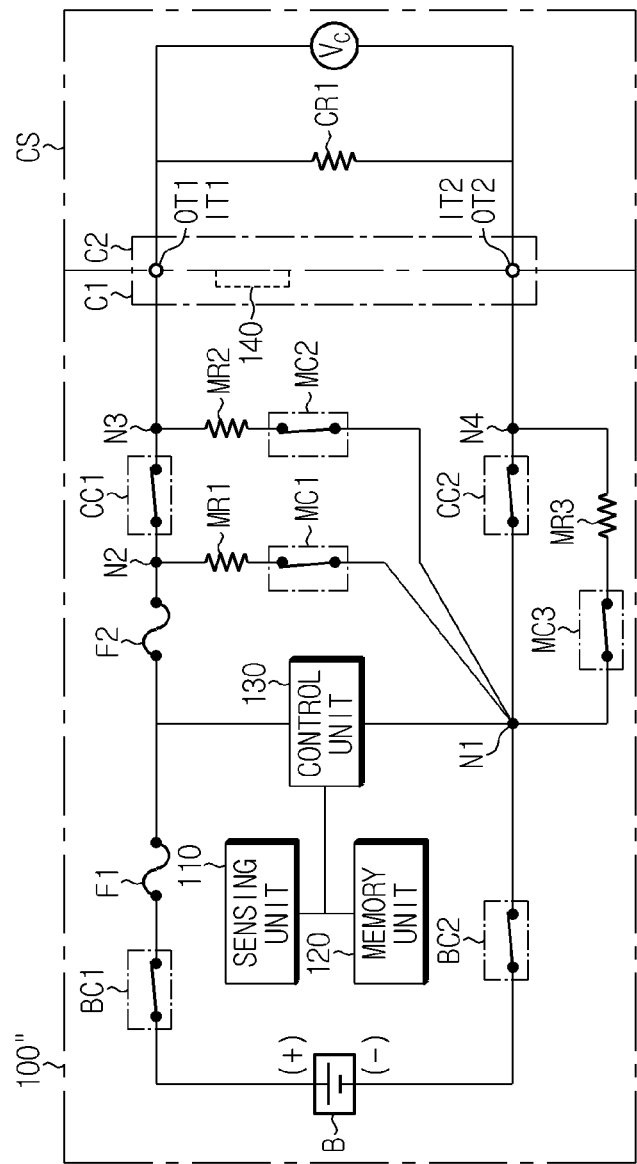
FIG. 7 is a diagram showing a functional configuration of a battery pack according to still another embodiment of the present disclosure in a state where the battery pack is coupled to a charger.
Figure 8:
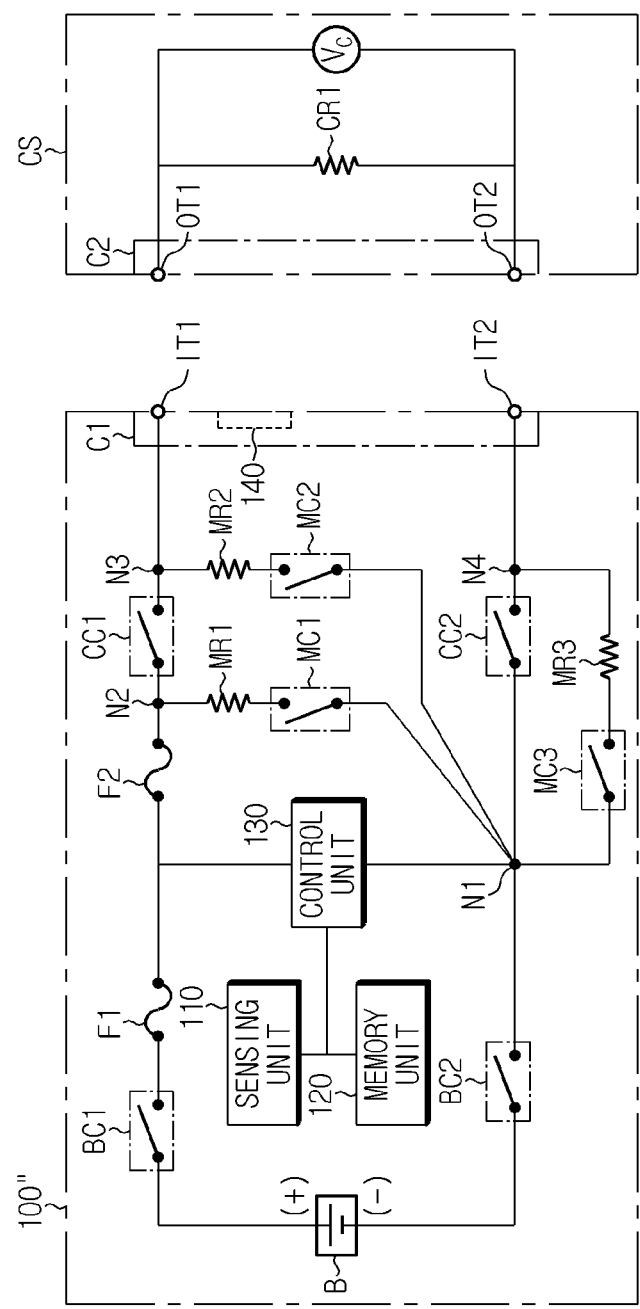
FIG. 8 is a diagram showing a functional configuration of the battery pack according to still another embodiment of the present disclosure in a state where the battery pack is separated from the charger.

FIG. 7 is a diagram showing a functional configuration of the battery pack 100_according to still another embodiment of the present disclosure in a state where the battery pack 100_is coupled to a charger CS, and FIG. 8 is a diagram showing a functional configuration of the battery pack 100_according to still another embodiment of the present disclosure in a state where the battery pack 100_is separated from the charger CS.

Referring to FIGS. 7 and 8, the battery pack 100_according to still another embodiment of the present disclosure may further include an illumination intensity sensing unit 140, compared to the battery pack 100ˇ according to the former embodiment of the present disclosure.

The illumination intensity sensing unit 140 is installed at an inner side of the first power connector C1 to sense an illumination intensity around the first power connector C1.

More specifically, if the first power connector C1 and the second power connector C2 of the charger CS are coupled, the illumination intensity sensing unit 140 is installed on a surface of the first power connector C1 inside the space sealed by the first power connector C1 and the second power connector C2 of the charger CS.

Meanwhile, the first power connector C1 may include a connector cover.

At this time, if the connector cover is closed, the illumination intensity sensing unit 140 is installed on the surface of the first power connector C1 inside the inner space of the first power connector C1 and the space sealed by the connector cover.

That is, if the first power connector C1 is coupled to the second power connector C2 of the charger CS or the connector cover of the first power connector C1 is closed, the illumination intensity sensing unit 140 may be located in a sealed space into which no light is introduced, as shown in FIG. 7.

By using this, the control unit 130 compares the illumination intensity around the first power connector C1 measured by the illumination intensity sensing unit 140 with a preset reference illumination intensity, and controls the operation state of at least one of the first measurement contactor MC1, the second measurement contactor MC2 and the third measurement contactor MC3 based on the comparison result.

Here, the preset reference illumination intensity may be an illumination intensity value for determining whether the first input terminal IT1 and the second input terminal IT2 of the first power connector C1 are exposed to the outside.

More specifically, if the illumination intensity around the first power connector C1 measured by the illumination intensity sensing unit 140 is equal to or greater than the preset reference illumination intensity, as shown in FIG. 8, the control unit 130 determines that the first power connector C1 is separated from the second power connector C2 of the charger CS or the connector cover of the first power connector C1 is opened.

That is, if the illumination intensity around the first power connector C1 measured by the illumination intensity sensing unit 140 is equal to or greater than the preset reference illuminati on intensity, the control unit 130 determines that the first input terminal IT1 and the second input terminal IT2 of the first power connector C1 are exposed to the outside.

Conversely, if the illumination intensity around the first power connector C1 measured by the illumination intensity sensing unit 140 is smaller than the preset reference illumination intensity, as shown in FIG. 7, the control unit 130 determines that the first power connector C1 is coupled to the second power connector C2 of the charger CS or the connector cover of the first power connector C1 is closed.

That is, if the illumination intensity around the first power connector C1 measured by the illumination intensity sensing unit 140 is smaller than the preset reference illumination intensity, the control unit 130 determines that the first input terminal IT1 and the second input terminal IT2 of the first power connector C1 are not exposed to the outside.

After that, if the illumination intensity around the first power connector C1 measured by the illumination intensity sensing unit 140 is equal to or greater than the preset reference illumination intensity, the control unit 130 controls the operation states of the first measurement contactor MC1, the second measurement contactor MC2 and the third measurement contactor MC3 to turn off.

In addition, if the illumination intensity around the first power connector C1 measured by the illumination intensity sensing unit 140 is equal to or greater than the preset reference illumination intensity, the control unit 130 controls the operation states of the first charging contactor CC1 and the second charging contactor CC2 to turn off.

By doing so, if the first input terminal IT1 and the second input terminal IT2 of the first power connector C1 are exposed to the outside, the control unit 130 controls the operation states of the first measurement contactor MC1, the second measurement contactor MC2 and the third measurement contactor MC3 to turn off, thereby preventing an accident that a user is electrically shocked by the first input terminal IT1 or the second input terminal IT2 exposed to the outside.

Meanwhile, a vehicle according to the present disclosure may include the battery pack according to the present disclosure described above.

The embodiments of the present disclosure described above are not necessarily implemented by apparatuses and methods but may also be implemented through a program for realizing functions corresponding to the configuration of the present disclosure or a recording medium on which the program is recorded. Such implementation may be easily performed by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

What is claimed is:

1. A battery pack, comprising:
    a first battery contactor, wherein a first end of the first battery connector is configured to be electrically connected to a positive electrode terminal of a battery;
    a second battery contactor, wherein a first end of the second battery connector is configured to be electrically connected to a negative electrode terminal of the battery;
    a first charging contactor, wherein a first end of the first charging contactor is electrically connected to a second end of the first battery contactor;
    a second charging contactor, wherein a first end of the second charging contactor is electrically connected to a second end of the second battery contactor;
    a first measurement resistor electrically connected between a first node located at the first end of the second charging contactor and a second node located at the first end of the first charging contactor;
    a second measurement resistor electrically connected between the first node and a third node located at a second end of the first charging contactors;
    a third measurement resistor electrically connected between the first node and a fourth node located at a second end of the second charging contactor;
    a first power connector having:
        a first input terminal electrically connected to the second end of the first charging contactor; and
        a second input terminal electrically connected to the second end of the second charging contactor; and
    a control unit configured to, when first and second output terminals of a second power connector of a charger are electrically connected to the first input terminal and the second input terminal of the first power connector, respectively:
        receive a charging end request signal from the charger;
        control changes of the first charging contactor and the second charging contactor between a turn-on state and a turn-off state in order; and
        diagnose a fault of each of the first charging contactor and the second charging contactor based on at least one of a first measured voltage measured across the first measurement resistor, a second measured voltage measured across the second measurement resistor, or a third measured voltage measured across the third measurement resistor.

2. The battery pack according to claim 1,
    wherein the control unit is configured to:
        control the second charging contactor to change from the turn-on state to the turn-off state; and
        determine a turn-off fault of the second charging contactor based on the third measured voltage that is measured while the second charging contactor is in the turn-off state.

3. The battery pack according to claim 2,
    wherein when the third measured voltage is less than a second reference voltage, the control unit is configured to determine that a turn-off fault occurs at the second charging contactor.

4. The battery pack according to claim 1,
    wherein the control unit is configured to:
        diagnose a fault of the second charging contactor based on the third measured voltage;
        control the first charging contactor to change from the turn-on state to the turn-off state; and
        determine a turn-off fault of the first charging contactor based on a measured voltage difference between the first measured voltage and the second measured voltage that are measured while the first charging contactor is in the turn-off state.

5. The battery pack according to claim 4,
    wherein when the measured voltage difference between the first measured voltage and the second measured voltage is smaller than a first reference voltage, the control unit is configured to determine that a turn-off fault occurs at the first charging contactor.

6. The battery pack according to claim 1,
    wherein when it is determined that a fault occurs in at least one of the first charging contactor and the second charging contactor, the control unit is configured to output a fault signal.

7. A vehicle, comprising a battery pack according to claim 1.

* * * * *